United States Patent
Chen

(10) Patent No.: US 7,697,298 B2
(45) Date of Patent: Apr. 13, 2010

(54) HEAT DISSIPATION APPARATUS

(75) Inventor: Rung-An Chen, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 5 days.

(21) Appl. No.: 12/238,444

(22) Filed: Sep. 26, 2008

(65) Prior Publication Data

US 2010/0053905 A1 Mar. 4, 2010

(30) Foreign Application Priority Data

Aug. 26, 2008 (CN) .......................... 2008 1 0304197

(51) Int. Cl.
*H05K 7/20* (2006.01)
(52) U.S. Cl. ............... 361/719; 165/80.3; 361/704; 361/707; 257/718; 257/719; 257/727; 248/507
(58) Field of Classification Search ............. 361/704, 361/707, 709; 257/718, 719, 727; 165/80.3
See application file for complete search history.

(56) References Cited

U.S. PATENT DOCUMENTS

| | | | | |
|---|---|---|---|---|
| 5,903,434 A * | 5/1999 | Chiou | ............... | 361/704 |
| 5,932,925 A * | 8/1999 | McIntyre | ............... | 257/719 |
| 6,246,584 B1 * | 6/2001 | Lee et al. | ............... | 361/704 |
| 6,282,093 B1 * | 8/2001 | Goodwin | ............... | 361/704 |
| 6,724,632 B2 * | 4/2004 | Lee et al. | ............... | 361/719 |
| 6,816,375 B2 * | 11/2004 | Kalyandurg | ............... | 361/704 |
| 6,882,534 B2 * | 4/2005 | Wang et al. | ............... | 361/704 |
| 7,321,492 B2 * | 1/2008 | Wang et al. | ............... | 361/709 |
| 7,375,963 B2 * | 5/2008 | Eckberg et al. | ............... | 361/704 |
| 7,589,972 B2 * | 9/2009 | Ma et al. | ............... | 361/719 |
| 2002/0060064 A1 * | 5/2002 | Yu | ............... | 165/80.3 |
| 2008/0191341 A1 * | 8/2008 | Nishiyama | ............... | 257/719 |

* cited by examiner

*Primary Examiner*—Boris L Chervinsky
(74) *Attorney, Agent, or Firm*—Frank R. Niranjan

(57) ABSTRACT

A heat dissipation apparatus (10) includes a heat spreader (30), and first and second resilient plates (40, 50) provided at two opposite sides of the heat spreader. The first resilient plate includes a mounting arm (41) and two fixing arms (42) extending from two opposite ends of the mounting arm, respectively. The mounting arm defines a first mounting hole (43) therein, and each of the fixing arms defines a first fixing hole (44) therein. The second resilient plate defines a second mounting hole (53) and two second fixing holes (54) therein. The first resilient plate is fixed on the heat spreader via the first fixing holes. The second resilient plate is fixed on the heat spreader via the second fixing holes. The heat spreader is fixed on a circuit board via the first and the second mounting holes.

15 Claims, 5 Drawing Sheets

HEAT DISSIPATION APPARATUS

BACKGROUND

1. Technical Field

The present invention generally relates to heat dissipation apparatuses, and particularly to a heat dissipation apparatus for dissipating heat generated by electronic components.

2. Description of Related Art

It is well known that heat is generated by electronic components such as integrated circuit chips during operation thereof. If the heat is not efficiently removed, these electronic components may suffer damage. Thus, heat dissipation apparatuses are often used to cool the electronic components.

A typical heat dissipation apparatus includes a heat spreader, a heat sink and a heat pipe thermally connecting with the heat spreader and the heat sink. The heat spreader is in contact with an electronic component, such as CPU and so on, which is disposed on a circuit board. The heat spreader includes four sleeves respectively formed at four corners thereof. Each of the sleeves receives a screw therein. During assembly, the spreader is fixed on the circuit board via the four screws, for contacting intimately with the electronic component.

However, fixing the heat spreader on the circuit board with so many screws complicates an assembly process and increases a production cost of the heat dissipation apparatus. As well, four holes respectively aligning with the four screws are required to be defined in the circuit board, which causes an inconvenience for layout of circuitry on the circuit board. On the other hand, points of application of force on the heat spreader will be reduced if fewer screws are employed. Thus, the heat spreader can not contact intimately with the electronic component.

What is needed, therefore, is a heat dissipation apparatus which overcomes the described limitations.

SUMMARY

A heat dissipation apparatus according to an embodiment of the present invention includes a heat spreader, and first and second resilient plates provided at two opposite sides of the heat spreader. The first resilient plate includes a mounting arm and two fixing arms extending from two opposite ends of the mounting arm, respectively. The mounting arm defines a first mounting hole therein, and each of the fixing arms defines a first fixing hole therein. The second resilient plate defines a second mounting hole and two second fixing holes therein. The first resilient plate is fixed on the heat spreader via the first fixing holes. The second resilient plate is fixed on the heat spreader via the second fixing holes. The heat spreader is fixed on a circuit board via the first and the second mounting holes.

Other advantages and novel features of the present invention will become more apparent from the following detailed description when taken in conjunction with the accompanying drawings.

BRIEF DESCRIPTION OF THE DRAWINGS

Many aspects of the present heat dissipation apparatus can be better understood with reference to the following drawings. The components in the drawings are not necessarily drawn to scale, the emphasis instead being placed upon clearly illustrating the principles of the disclosed heat dissipation apparatus. Moreover, in the drawings, like reference numerals designate corresponding parts throughout the several views.

DETAILED DESCRIPTION OF THE EMBODIMENTS

Figure 1:
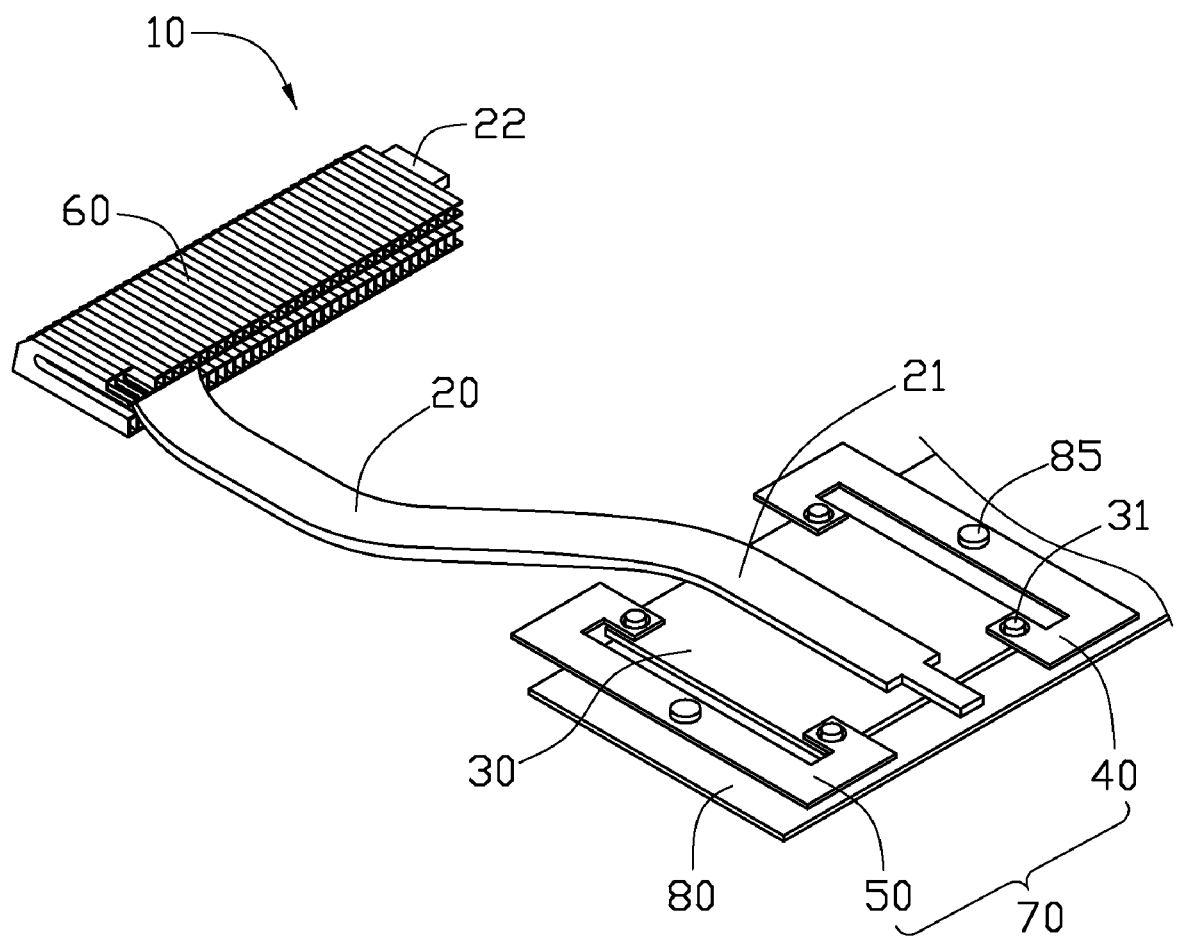
FIG. 1 is an assembled, isometric view of a heat dissipation apparatus in accordance with a first embodiment of the present invention, the heat dissipation apparatus being fixed on a circuit board.
Figure 2:
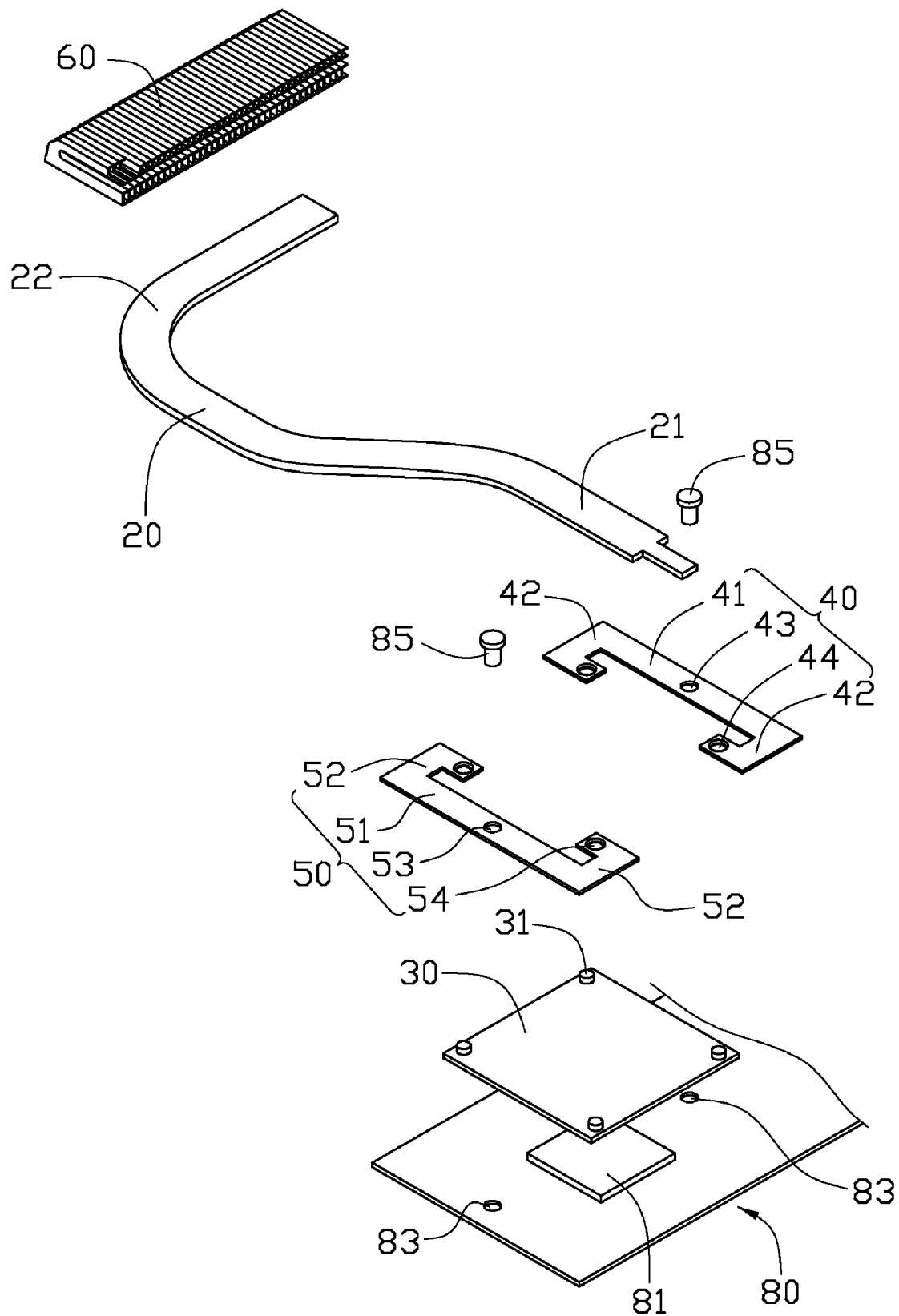
FIG. 2 is an exploded, isometric view of the heat dissipation apparatus and the circuit board of FIG. 1.

Referring to FIGS. 1 and 2, a heat dissipation apparatus 10 in accordance with a first embodiment of the present invention is shown. The heat dissipation apparatus 10 includes a heat pipe 20, a heat spreader 30, a heat sink 60, and a mounting structure 70 for fixing the heat spreader 30 on a circuit board 80. The heat pipe 20 includes an evaporating section 21 attached to a top surface of the heat spreader 30, and a condensing section 22 attached to the heat sink 60, for thermally connecting the heat spreader 30 with the heat sink 60.

The heat spreader 30 is a squared plate, and has a high heat conductivity. Preferably, the heat spreader is made of copper. The heat spreader includes four pins 31 respectively formed at four corners thereof. The pins 31 are protruded upwardly from a top surface of the spreader 30, for fixing the mounting structure 70 thereon.

The mounting structure 70 includes a first resilient plate 40 and a second resilient plate 50. The first resilient plate 40 includes a mounting arm 41 and two fixing arms 42 integrally formed therewith as a single piece. The mounting arm 41 is linearly shaped, and defines a first mounting hole 43 at a middle thereof. The fixing arms 42 are L-shaped, and extend vertically from two opposite ends of the mounting arm 41, respectively. The fixing arms 42 are oriented face to face, with free ends thereof extending toward and spacing a distance from each other. Each of the fixing arms 42 defines a first fixing hole 44 in the free end thereof. The first fixing hole 44 aligns with one of the pins 31 on the heat spreader 30. The second resilient plate 50 has a same structure as the first resilient plate 40. The second resilient plate 50 includes a mounting arm 51, two fixing arms 52, a second mounting hole 53 in the middle of the mounting arm 51, and two second fixing holes 54 in the free ends of the fixing arms 52, respectively.

The circuit board 80 has a heat-generating electronic component 81 disposed thereon, such as a CPU and so on, and defines two locking holes 83 therein. The locking holes 83 are located at two opposite sides of the electronic component 81, and align with the first and second mounting holes 43, 53 of the first and second resilient plates 40, 50, respectively.

During assembly, the first and second resilient plates 40, 50 are disposed at two opposite sides of the heat spreader 30, respectively, with the first and the second fixing holes 44, 54 aligning with and securely receiving the pins 31 of the heat spreader 30 therein, whereby the first and the second resilient plates 40, 50 are fixed on the heat spreader 30. The fixation can be achieved by riveting the pins 31 to the first and second resilient plates 40, 50. The heat spreader 30 is disposed on the electronic component 81, with the first and second mounting holes 43, 53 of the first and second resilient plates 40, 50 aligning with the locking holes 83 of the circuit board 80, respectively. Two fasteners such as screws 85 are provided to extend through the first and the second mounting holes 43, 53 and the locking holes 83, so as to fix the heat spreader 30 on the circuit board 80.

In the heat dissipation apparatus 10, since the pins 31 of the heat spreader 30 are riveted to the first and second resilient plates 40, 50 at the first and the second fixing holes 44, 54 of the first and second resilient plates 40, 50, four points of application of force are respectively provided at the four corners of the heat spreader 30. Thus, the heat spreader 30 can be mounted with a mounting force evenly exerted thereon, whereby the heat spreader 30 can contact intimately and uniformly with the electronic component 81. As well, only two screws 85 through the first and the second mounting holes 43, 53 and the locking holes 83 are required to mount the heat spreader 30 on the circuit board 80, which simplifies the assembly and disassembly process, and reduces the production cost of the heat dissipation apparatus 10. In addition, a layout of circuitry on the circuit board 80 is relatively convenient since only two locking holes 84 are required in the circuit board 80.

Figure 3:
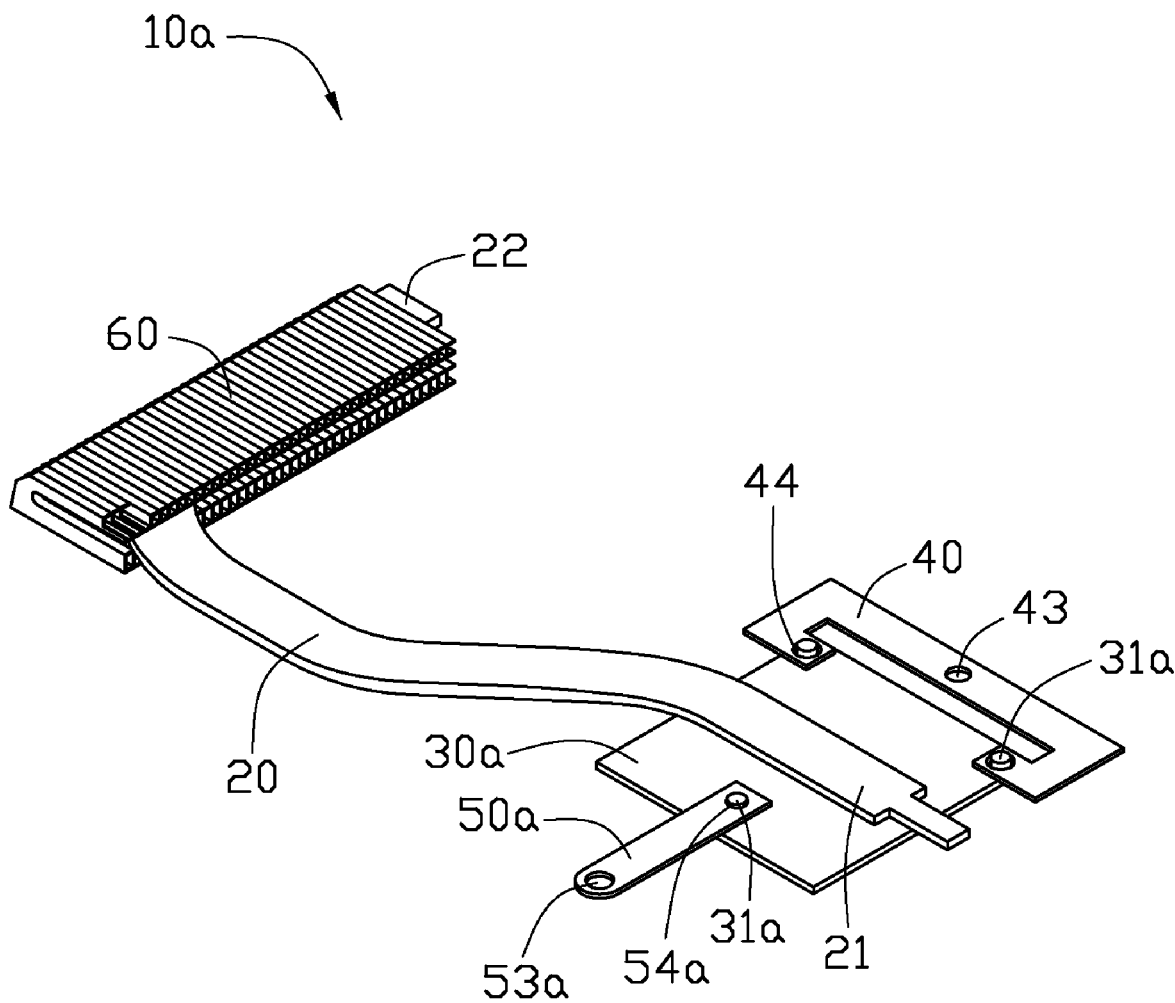
FIG. 3 is an assembled, isometric view of a heat dissipation apparatus in accordance with a second embodiment of the present invention.

Referring to FIG. 3, a heat dissipation apparatus 10a in accordance with a second embodiment of the present invention is shown. The heat dissipation apparatus 10a is similar to the heat dissipation apparatus 10 of the first embodiment. In the present embodiment, the second resilient plate 50a is linearly shaped, and defines a second mounting hole 53a and a second fixing hole 54a at two opposite ends thereof, respectively. The heat spreader 30a has three pins 31a protruded upwardly from a top surface thereof. Two of the pins 31a (i.e., first and second pins) are located at two corners of the heat spreader 30, respectively, for fixing the first resilient plate 40 to the heat spreader 30. The third pin 31a is located at a middle of an opposite side of the heat spreader 30 to the first and the second pin 31a, for fixing the second resilient plate 50a to the heat spreader 30. The second resilient plate 50a is disposed perpendicularly to the opposite side of the first resilient plate 40. The second fixing hole 54a of the second resilient plate 50a is fixed to the third pin 31a. The second mounting hole 53a of the second resilient plate 50a is used to mount the second resilient plate 50a on the circuit board 80.

Figure 4:
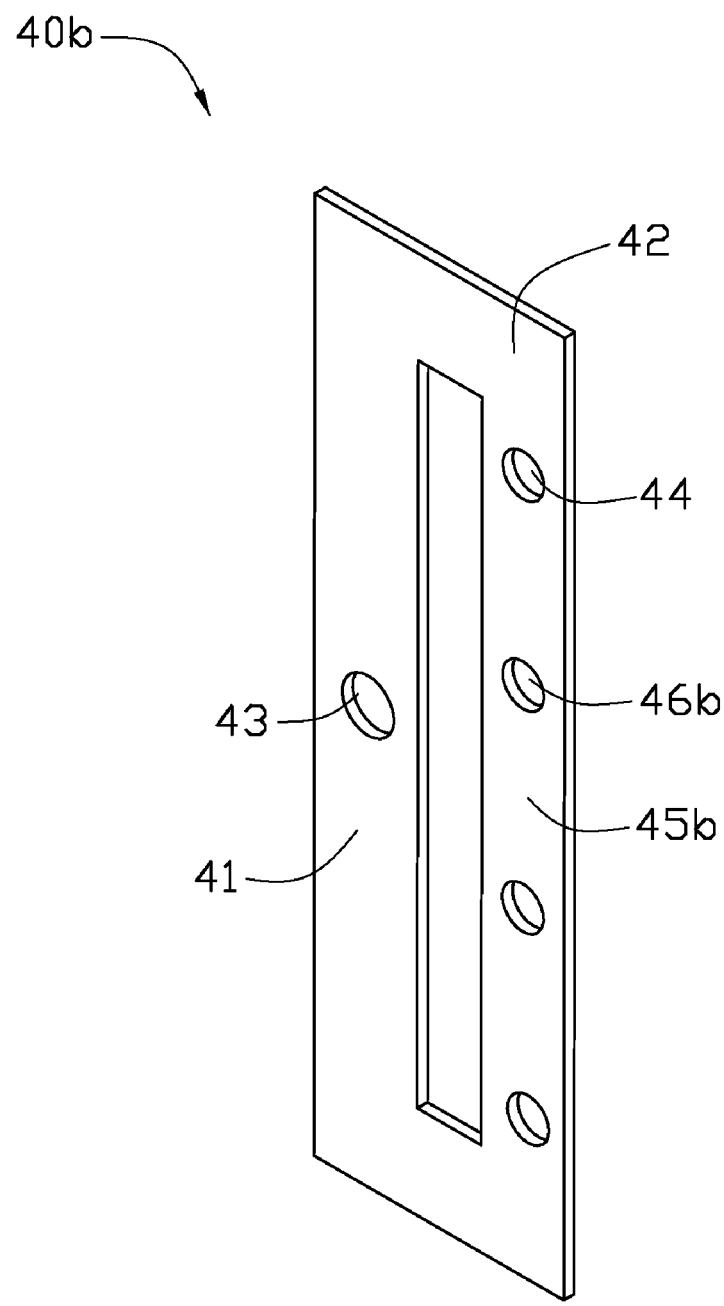
FIG. 4 is an isometric view of a first resilient plate of a heat dissipation apparatus in accordance with a third embodiment of the present invention.

Referring to FIG. 4, a first resilient plate 40b of a heat dissipation apparatus in accordance with a third embodiment of the present invention is shown. The first resilient plate 40b is similar to the first resilient plate 40 of the first embodiment. In the present embodiment, the first resilient plate 40b further includes a reinforcing arm 45b provided between the fixing arms 42. The reinforcing arm 45b connects with the free ends of the fixing arms 42, and is integrally formed with the fixing arms 42 as a single piece. The reinforcing arm 45b can reinforce the first resilient plate 40b. The reinforcing arm 45b defines two third fixing holes 46b which fix the reinforcing arm 45b to the heat spreader 30, so as to further increase the points of application of force on the heat spreader 30. Alternatively, the second resilient plate 50 of the first embodiment or the second resilient plate 50a of the second embodiment can have a same structure as the first resilient plate 40b.

Figure 5:
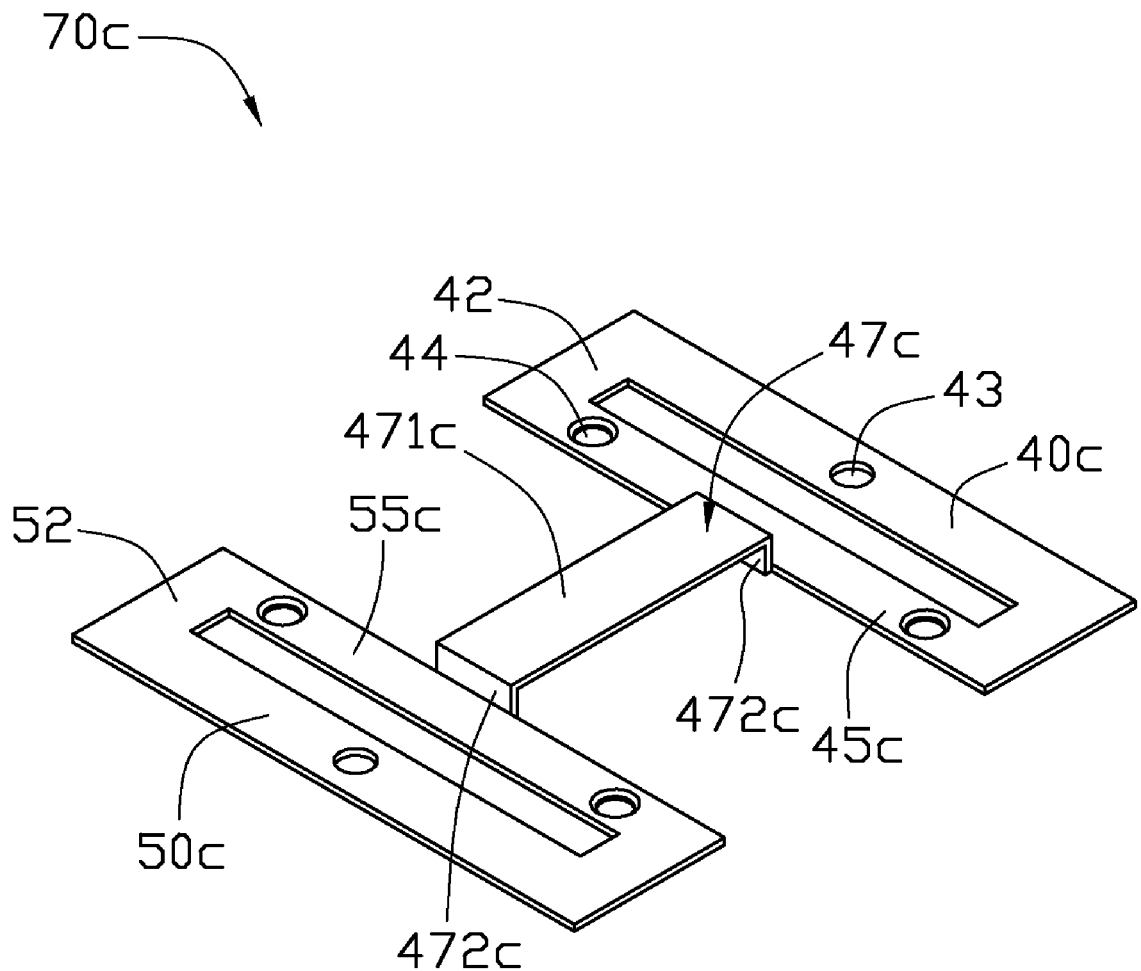
FIG. 5 is an assembled, isometric view of a mounting structure of a heat dissipation apparatus in accordance with a fourth embodiment of the present invention.

Referring to FIG. 5, a mounting structure 70c of a heat dissipation apparatus in accordance with a fourth embodiment of the present invention is shown. The mounting structure 70c includes a first resilient plate 40c, a second resilient plate 50c, and a connecting plate 47c interconnecting the first and second resilient plates 40c, 50c. The first resilient plate 40c is similar to the first resilient plate 40b of the third embodiment. In the present embodiment, the first resilient plate 40c includes a reinforcing arm 45c between the fixing arms 42. The reinforcing arm 45c connects with the free ends of the fixing arms 42, and is integrally formed with the fixing arms 42 as a single piece. The difference between the first resilient plate 40c of the present embodiment and the first resilient plate 40b of the third embodiment lies in that no third fixing holes 46b of the resilient plate 40b are provided at the reinforcing arm 45c of the present embodiment. The second resilient plate 50c has a same structure as the first resilient plate 40c, and also includes a reinforcing arm 55c. The connecting plate 47c includes an abutting arm 471c and two legs 472c vertically extending downwards from two opposite ends of the abutting arm 471c, respectively. The legs 472c connect with the reinforcing arms 45c, 55c of the first and the second resilient plates 40c, 50c, respectively. The abutting arm 471c abuts the evaporating section 21 of the heat pipe 20 when the heat pipe is mounted on the heat spreader 30, so as to secure the heat pipe 20 to contact intimately with the heat spreader 30.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation apparatus, comprising:
a heat spreader;
a first resilient plate provided at one side of the heat spreader, the first resilient plate comprising a mounting arm and two fixing arms extending from two opposite ends of the mounting arm, respectively, the mounting arm defining only one first mounting hole therein, each of the fixing arms defining a first fixing hole therein, the first resilient plate being fixed on the heat spreader via the first fixing hole of the first resilient plate; and
a second resilient plate provided at an opposite side of the heat spreader, the second resilient plate defining only one second mounting hole and at least one second fixing hole therein, the second resilient plate being fixed on the heat spreader via the at least one second fixing hole of the second resilient plate, the only one first mounting hole of the first resilient plate and the only one second mounting hole of the second resilient plate being adapted for mounting the heat spreader to a circuit board.

2. The heat dissipation apparatus of claim 1, wherein the mounting arm is linearly shaped, and the only one first mounting hole is defined at a middle of the mounting arm.

3. The heat dissipation apparatus of claim 2, wherein the fixing arms are L-shaped, with free ends thereof spacing a distance from each other, the first fixing hole of each of the fixing arms being defined in a corresponding free end of the each of the fixing arms.

4. The heat dissipation apparatus of claim 3, wherein the first resilient plate further comprises a reinforcing arm connecting with the free ends of the fixing arms, the reinforcing arm being integrally formed with the fixing arms as a single piece.

5. The heat dissipation apparatus of claim 4, wherein the reinforcing arm defines at least one third fixing hole therein, and the at least one third hole being fixed to the heat spreader.

6. The heat dissipation apparatus of claim 1, wherein the second resilient plate is linearly shaped, and the only one second mounting hole and the at least one second fixing hole are defined at two opposite ends of the second resilient plate, respectively.

7. The heat dissipation apparatus of claim 1, wherein the second resilient plate comprises a mounting arm and two fixing arms extending from two opposite ends of the mounting arm of the second resilient plate, respectively, the only one second mounting hole being defined in the mounting arm of the second resilient plate, the at least one second fixing hole being defined at each of the fixing arms of the second resilient plate.

8. The heat dissipation apparatus of claim 7, wherein the first and the second resilient plates each further comprises a reinforcing arm connecting with free ends of the fixing arms of each of the first and the second resilient plates, and the heat dissipation apparatus further comprises a connecting plate interconnecting the reinforcing arms of the first and the second resilient plates.

9. The heat dissipation apparatus of claim 8, wherein the connecting plate comprises an abutting arm and two legs downwardly extending from two opposite ends of the abutting arm, respectively, the legs connecting with the reinforcing arms of the first and the second resilient plates, respectively.

10. The heat dissipation apparatus of claim 1, further comprising a heat sink and a heat pipe thermally connecting the heat spreader with the heat sink.

11. A heat dissipation apparatus, comprising:
a heat spreader being adapted for thermally connecting with a heat-generating component disposed on a circuit board;
a first resilient plate provided at one side of the heat spreader, the first resilient plate defining only one mounting hole and at least two fixing holes therein, the first resilient plate being fixed to the heat spreader via the fixing holes of the first resilient plate; and
a second resilient plate provided at an opposite side of the heat spreader, the second resilient plate defining only one mounting hole and at least one fixing hole therein, the second resilient plate being fixed to the heat spreader via the at least one fixing hole of the second resilient plate, the only one mounting hole of the first resilient plate and the only one mounting hole of the second resilient plate being adapted for mounting the heat spreader to the circuit board.

12. The heat dissipation apparatus of claim 11, wherein the first resilient plate comprises a mounting arm and two fixing arms extending from two opposite ends of the mounting arm, respectively, the only one mounting hole of the first resilient plate is defined in the mounting arm thereof, the fixing holes are defined in the fixing arms, and the first resilient plate is fixed to two of four corners of the heat spreader.

13. The heat dissipation apparatus of claim 12, wherein the second resilient plate has a same structure as the first resilient plate, and the second resilient plate is fixed to the other two of the four corners of the heat spreader.

14. The heat dissipation apparatus of claim 12, wherein the second resilient plate is linearly shaped, the only one mounting hole of the second resilient plate and the at least one fixing hole are defined at two opposite ends of the second resilient plate, and the second resilient plate is fixed to a middle of a side of the heat spreader opposite to the first resilient plate.

15. The heat dissipation apparatus of claim 12, wherein the first resilient plate further comprises a reinforcing arm located between and connected with the fixing arms.

\* \* \* \* \*